United States Patent
Lu et al.

(10) Patent No.: US 8,704,383 B2
(45) Date of Patent: Apr. 22, 2014

(54) SILICON-BASED THIN SUBSTRATE AND PACKAGING SCHEMES

(75) Inventors: Szu-Wei Lu, Hsin-Chu (TW); Clinton Chao, Redwood Shores, CA (US); Ann Luh, Hsin-Chu (TW); Tjandra Winata Karta, Hsinchu (TW); Jerry Tzou, Hsin-Chu (TW); Kuo-Chin Chang, Chiayi (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/452,562

(22) Filed: Apr. 20, 2012

(65) Prior Publication Data

US 2012/0199974 A1 Aug. 9, 2012

Related U.S. Application Data

(62) Division of application No. 11/493,375, filed on Jul. 26, 2006, now Pat. No. 7,804,177, and a division of application No. 12/853,711, filed on Aug. 10, 2010, now Pat. No. 8,174,129.

(51) Int. Cl.
*H01L 23/48* (2006.01)
*H01L 23/52* (2006.01)

(52) U.S. Cl.
USPC ............ 257/778; 257/738; 257/784; 257/786

(58) Field of Classification Search
USPC ......... 257/690–692, 737, 738, 777, 778, 780, 257/784, 786, E23.067, E25.012, E25.013
See application file for complete search history.

(56) References Cited

U.S. PATENT DOCUMENTS

| | | |
|---|---|---|
| 5,808,874 A | 9/1998 | Smith |
| 5,861,322 A | 1/1999 | Caillat et al. |
| 6,525,414 B2 | 2/2003 | Shiraishi et al. |
| 6,658,082 B2 | 12/2003 | Okumura et al. |
| 6,671,947 B2 | 1/2004 | Bohr |
| 6,962,872 B2 | 11/2005 | Chudzik et al. |
| 7,057,294 B2 | 6/2006 | Shibata |
| 7,071,576 B2 | 7/2006 | Nakayoshi et al. |
| 7,081,402 B2 | 7/2006 | Hsu et al. |
| 7,307,348 B2 | 12/2007 | Wood et al. |
| 7,327,018 B2 | 2/2008 | Chung |

(Continued)

OTHER PUBLICATIONS

Baliga, J., "Carbon-Silicon Carbide for High-Density SiPs," Semiconductor International, http://www.reed-electronics.com/semiconductor/index.asp?layout=articlePrint&articleID=CA499683, Feb. 1, 2005, downloaded Jul. 14, 2006, 2 pages.

(Continued)

*Primary Examiner* — Hung Vu
(74) *Attorney, Agent, or Firm* — Slater & Matsil, L.L.P.

(57) ABSTRACT

A silicon-based thin package substrate is used for packaging semiconductor chips. The silicon-based thin package substrate preferably has a thickness of less than about 200 μm. A plurality of traces is formed in the silicon-based thin package substrate, connecting BGA balls and solder bumps. A semiconductor chip may be mounted on the solder bumps. The silicon-based thin package substrate may be used as a carrier of semiconductor chips.

22 Claims, 7 Drawing Sheets

(56) References Cited

U.S. PATENT DOCUMENTS

| | | |
|---|---|---|
| 2003/0011069 A1 | 1/2003 | Shibata |
| 2004/0253803 A1* | 12/2004 | Tomono et al. ............... 438/614 |
| 2005/0029675 A1 | 2/2005 | Hua |
| 2005/0212114 A1* | 9/2005 | Kawano et al. ............... 257/690 |
| 2006/0027934 A1 | 2/2006 | Edelstein et al. |
| 2006/0076659 A1 | 4/2006 | Chung |
| 2006/0097906 A1 | 5/2006 | Heide |
| 2006/0151870 A1* | 7/2006 | Nishiyama et al. ........... 257/700 |

OTHER PUBLICATIONS

Tsou, C., et al., "Packaging Design with Thermal Analysis of LED on Silicon Substrate," NSTI-Nanotech 2005, vol. 3, 2005, pp. 513-516.

ZyCube 3D Technology, http://www.zy-cube.com/e/technology/ZyCube%203D/ 3dtechnology.html, downloaded Jul. 17, 2006, 4 pages.

http://journal.mycom.co.jp/news/2004/11/15/006.html, MYCOM, Nov. 15, 2004, downloaded Jul. 17, 2006, 4 pages.

* cited by examiner

SILICON-BASED THIN SUBSTRATE AND PACKAGING SCHEMES

This application is a divisional of U.S. patent application Ser. No. 11/493,375, filed Jul. 26, 2006, and entitled "Silicon-Based Thin Substrate and Packaging Schemes," and a divisional of U.S. patent application Ser. No. 12/853,711, filed Aug. 10, 2010, and entitled "Silicon-Based Thin Substrate and Packaging Schemes," which applications are hereby incorporated herein by reference.

TECHNICAL FIELD

This invention relates generally to the packaging of semiconductor chips, and more particularly to packaging materials and methods for reducing stress in packages.

BACKGROUND

The fabrication of modern circuits typically includes several steps. Integrated circuits are first fabricated on a semiconductor wafer, which contains multiple duplicated semiconductor chips, each comprising integrated circuits. The semiconductor chips are then cut from the wafer and packaged. The packaging processes have two main purposes: to protect delicate semiconductor chips; and to connect interior integrated circuits to exterior pins.

In conventional packaging processes, semiconductor chips are mounted on a module substrate using flip-chip bonding or wire bonding. Underfill is used to prevent cracks from being formed in solder bumps or solder balls, wherein cracks are typically caused by thermal stresses.

With the increasing demand for more functions, system in package (SiP) technology, in which two or more chips are packaged on one module substrate, has increasingly been used. With a high degree of integration at the module level, the electrical performance is improved due to the shortened connecting path between components. By using SiP, package design becomes more flexible and less complex. Time-to-market is also reduced for product upgrades.

SiP, however, has a greater package size than single chip packages. As a result, greater stress is introduced. Furthermore, the non-uniformity in package stress distribution becomes more severe. Due to the greater stress in local regions, SiP packages are more prone to failures. Possible failures in a SiP package include bump cracking, substrate cracking, low-k material or underfill delaminating, BGA ball cracking, etc. These failures cannot be solved even by using advanced substrates, for example, organic substrates formed of materials with low coefficients of thermal expansion (CTE) (for core and build-up layers). As is known in the art, advanced substrates are introduced for enhanced electrical performance in packages, but are also expected to reduce stresses in the packages.

Accordingly, what is needed in the art are new structures and/or packaging schemes for SiP packages to take advantage of the benefits associated with the greater degree of integration while at the same time overcoming the deficiencies of the prior art.

SUMMARY OF THE INVENTION

In accordance with one aspect of the present invention, the preferred embodiments of the present invention provide a silicon-based thin package substrate for packaging a semiconductor chip. The silicon-based thin package substrate preferably has a thickness of less than about 200 μm, and more preferably less than about 50 μm.

In accordance with another aspect of the present invention, the preferred embodiments of the present invention provide a semiconductor package assembly including a silicon-based package substrate, a semiconductor chip over the silicon-based package substrate, wherein the semiconductor chip comprises at least one low-k dielectric layer having a k value of less than about 3.0, and a plurality of solder bumps coupling the semiconductor chip and the silicon-based package substrate. The plurality of solder bumps preferably has a lead concentration substantially less than about five percent.

In accordance with yet another aspect of the present invention, the preferred embodiments of the present invention provide a silicon-based package substrate including a plurality of BGA balls, and a plurality of metal traces connected to the BGA balls. The silicon-based package substrate has a thickness of less than about 200 μm and contains over about 40 percent silicon.

The preferred embodiments of the present invention have several advantageous features. Since stresses in the package assembly are reduced, low-k dielectric layer delaminating and cracking are thus reduced, and lead-free solder bumps and high-lead solder bumps can be used with less concern for cracking. The ratio of metal line spacing to metal line width may be increased, so that cross-talk is reduced.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A significant problem for usage of organic substrates is the mismatch in the coefficients of thermal expansion (CTE) between components in the package assembly. For example, semiconductor chips are typically based on silicon substrates, which typically have a CTE of about 3 ppm/C or a little higher, while some organic package substrates may have CTEs of higher than about 17 ppm/C. The significant difference of CTEs introduces stress to the package assembly when thermal change occurs. One solution to this problem is through an underfill process, in which a liquid epoxy is dispensed along one or two sides of a chip to fill the gap between the chip and a substrate. Epoxy underfill helps spread the stress and protect the solder bumps.

With low-k dielectrics being widely used in integrated circuits used for forming interconnect structures, a dilemma exists between the need to protect solder bumps and the benefits of using low-k dielectrics. The protection of brittle bumps demands high strength underfills. However, the low-k dielectrics may be harmed by high-strength underfill material, causing problems such as delaminating.

A silicon-based package substrate is therefore preferred. Since the silicon-based package substrates and semiconductor chips, which are commonly formed on silicon substrates, have substantially the same CTE, stress caused by CTE mismatch is thus reduced or eliminated, depending on how close the CTEs are.

Although the stress caused by CTE mismatch between the semiconductor chip and the package substrate is reduced or eliminated, stresses still exist due to the CTE mismatch between the package substrate and the printed circuits board (PCB). The stresses will be applied on the ball grid array (BGA) balls interposed between the package substrate and the PCB, and in turn applied on the package substrate. Further improvement is thus needed.

Figure 1:
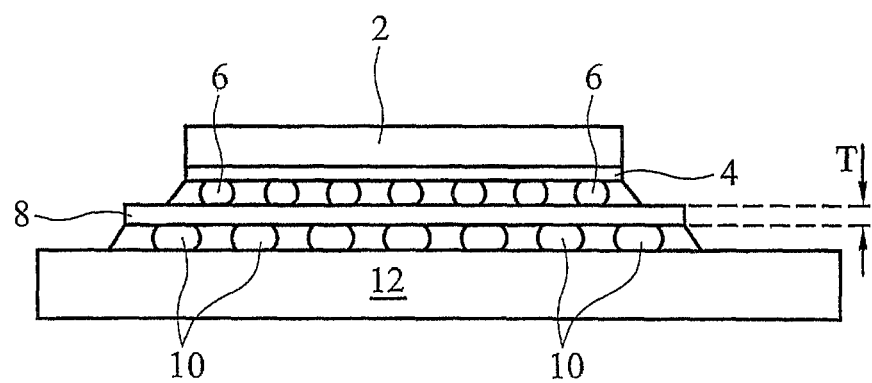
FIG. 1 illustrates a conventional flip-chip package.

Simulations have been performed to determine the relationship between the thickness of the package substrate and the stresses applied on BGA balls. FIG. 1 illustrates a portion of a typical flip-chip package. A semiconductor chip 2, which comprises at least a low-k material (for example, inter-layer dielectric or inter-metal dielectric) 4, is flip-mounted on a package substrate 8 through solder bumps 6. The package substrate 8 is assembled to a printed circuit board (PCB) 12 through BGA balls 10.

Figure 2:
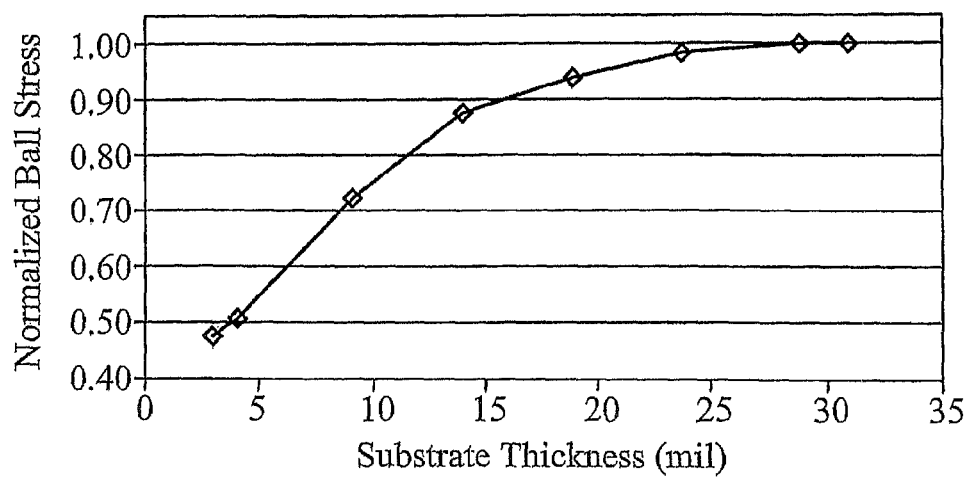
FIG. 2 shows the normalized stress applied on BGA balls as a function of the thickness of the package substrate.

The results are shown in FIG. 2, which illustrates normalized stress in BGA balls as a function of substrate thickness T, wherein BGA ball stress in a package substrate of 31 mils is used as a normalization base. During the simulation, sample packages undergo thermal cycles between about 0° C. and about 100° C., with a temperature ramp rate of about 10° C./minute. It has been found that the stresses applied on BGA balls 10 decrease when the substrate thickness T decreases. When substrate thickness T is reduced from 31 mils to 3 mils, the stress applied on BGA balls 10 is reduced by 52%. The simulation results have revealed that thin package substrates are helpful for reducing the stresses in BGA balls, and the thinner the package substrate is, the smaller the stresses that are applied.

Based on the above analysis, the preferred embodiments of the present invention provide silicon-based thin (package) substrates. Corresponding packaging schemes are also provided. Preferably, the thickness of the silicon substrate is less than about 200 μm, and more preferably less than about 50 μm. It is appreciated that the more silicon contained in the silicon-based substrate, the better the CTE match achieved. Therefore, the silicon-based thin substrate preferably comprises more than about 40 percent silicon, and more preferably more than about 60 percent silicon.

Figure 3:
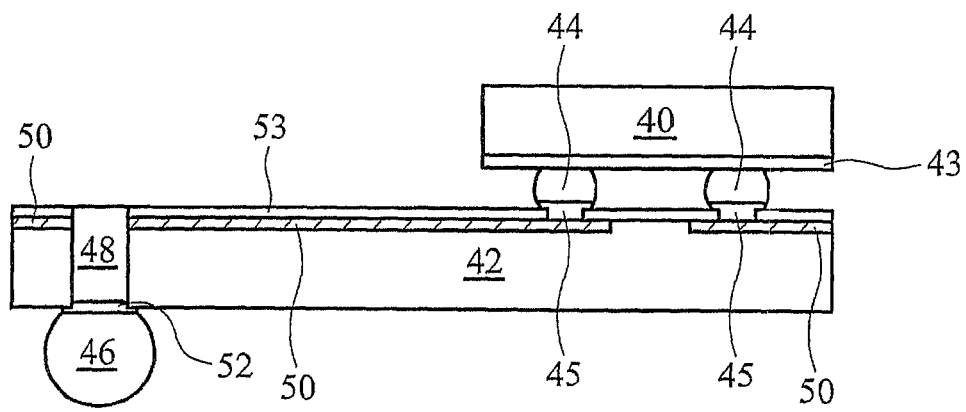
FIGS. 3 through 4C illustrate a packaging scheme, wherein through-hole vias are formed in a silicon-based thin substrate.
Figure 4A:
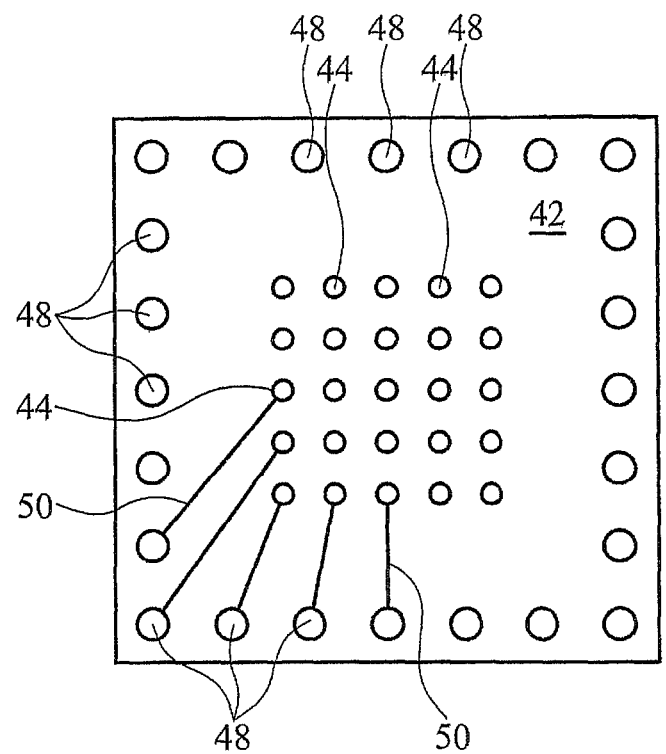
Figure 4B:
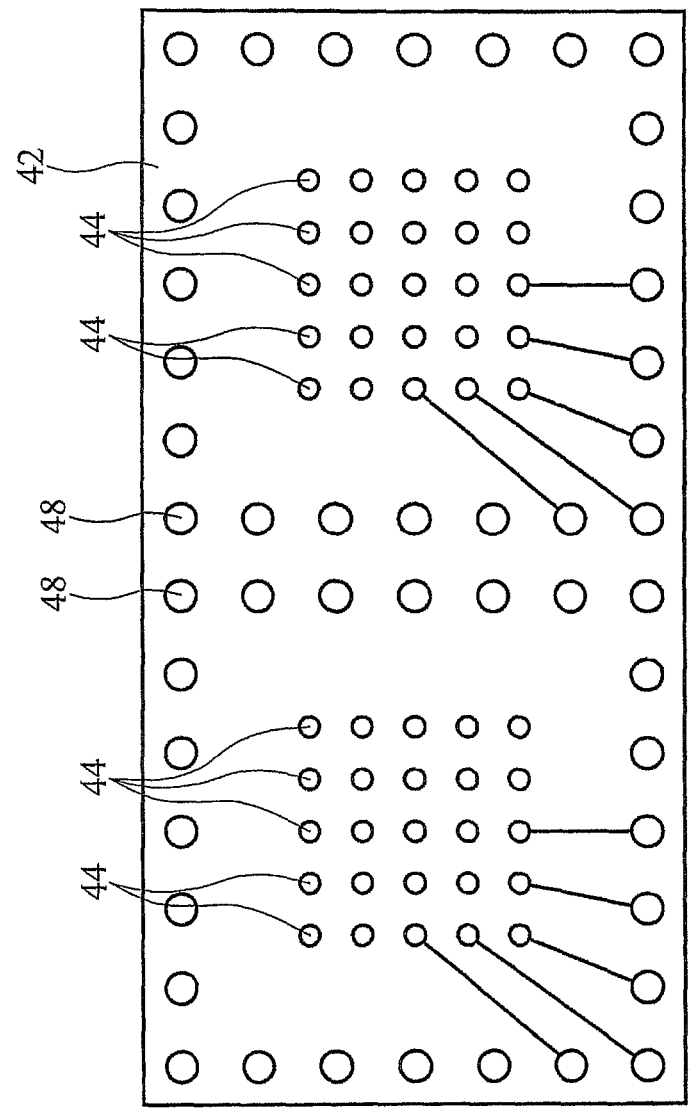
Figure 4C:
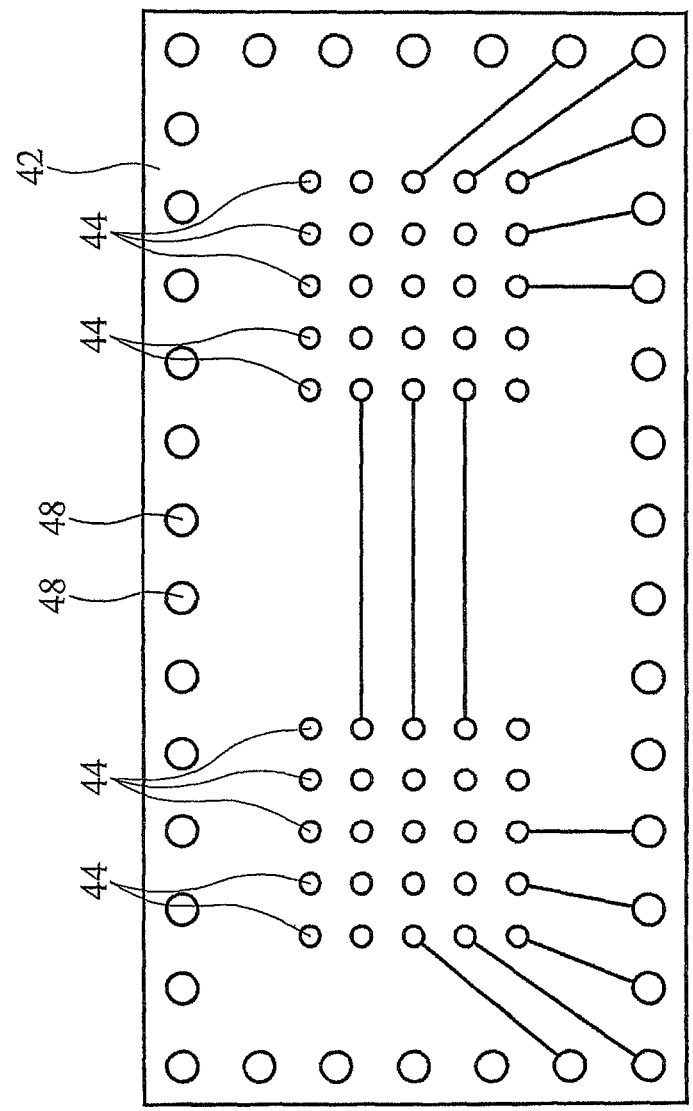

FIGS. 3 through 4C illustrate a packaging scheme for a silicon-based thin substrate, wherein through-hole vias are formed in the silicon-based thin package substrate. A cross-sectional view of a portion of the package assembly is shown in FIG. 3. A semiconductor chip 40, also referred to as a die in packaging art, is attached to a silicon-based thin substrate 42 through solder bumps 44. Semiconductor chip 40 preferably includes a low-k dielectric layer 43, which is weak in mechanical strength. When under stress, the low-k dielectric layer 43 may suffer delaminating and cracking. With the presence of low-k dielectric layers, lower stress is required.

Under-bump metallizations (UBMs) 45 are formed on the silicon-based thin substrate 42 for better contact with the solder bumps 44. Metal traces 50 route the connections from solder bumps 44 to through-hole vias 48, which are formed in through-holes in the silicon-based thin substrate 42. A passivation layer 53 protects metal traces 50.

As a silicon-based substrate is used, metal traces 50 may be formed using common methods for forming interconnect lines in integrated circuits. One advantageous feature is that metal traces formed on the silicon-based substrate having very small widths, for example, 0.6 μm or less, can be easily formed. In one embodiment, metal traces 50 having at least two conductive layers are formed of metals such as aluminum, copper, tungsten, titanium, and combinations thereof. The preferred formation steps include depositing a metal layer and etching undesired portions, leaving the metal traces 50. In other embodiments, metal traces 50 can be formed using well-known damascene processes.

Through-hole vias 48 preferably comprise copper, tungsten, solder, and combinations thereof. In the preferred embodiment, through-holes are formed by Micro-Electro-Mechanical Systems (MEMS) technology. Through-hole vias 48 are then filled.

In other embodiments, through-holes 48 are first formed, preferably by etching or drilling. A metal thin film is then formed on sidewalls of the through-holes, wherein the metal thin film preferably comprises copper, titanium, and the like, as well as combinations thereof. Stud bumps, which preferably comprise copper, are pushed into the through-holes, forming through-hole vias 48.

Bump pads 52 are optionally formed on the bottom surface of the through-hole vias 48, depending on the area ratio of the through-hole vias 48 to the BGA balls attached thereon. If the areas of the through-holes (viewed from the top or the bottom) are close to the contact areas of the BGA balls 46, the bump pads 52 are not needed. Otherwise, the bump pads 52 will be formed to increase the contact area.

A top view of the above-discussed scheme is shown in FIG. 4A. Preferably, through-hole vias 48 surround solder bumps 44, on which one or more dies will be attached. Through-hole vias 48 are connected to BGA balls (not shown), which are on the other side of the silicon-based thin substrate 42. It is appreciated that the scheme shown in FIG. 4A is more suitable for packaging semiconductor chips with limited I/O connections. If an excessive number of I/O connections are needed by the semiconductor chips, multiple layers of metal traces and more rows and columns of through-hole vias are needed. It is appreciated that multiple layers of metal traces can be formed using similar methods for the formation of interconnect structures in semiconductor chips.

FIG. 4B illustrates a top view of a portion of the SiP package with two semiconductor chips attached, with each group of solder bumps 44 surrounded by a group of through-hole vias 48. If the two semiconductor chips have multiple I/O connections connecting to each other, a package scheme shown in FIG. 4C is preferably adopted.

Figure 5:
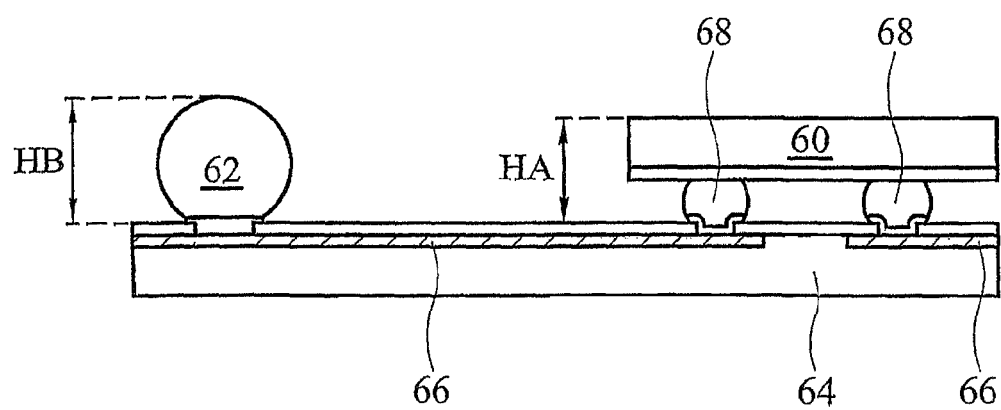
FIGS. 5 and 6 illustrate a packaging scheme, wherein no through-hole vias are formed in a silicon-based thin substrate.

FIG. 5 illustrates a cross-sectional view of a further packaging scheme, wherein no through-holes are formed. The semiconductor chip 60 and BGA balls 62 are on the same side of the silicon-based thin substrate 64. The integrated circuits in the semiconductor chip 60 are coupled to the BGA balls 62 through metal traces 66. Please note that in this scheme, the combined height HA of the semiconductor chip 60 and solder bumps 68 is smaller than the height HB of the BGA balls 62, so that the semiconductor chip does not prevent the BGA balls from contacting a PCB.

Figure 6:
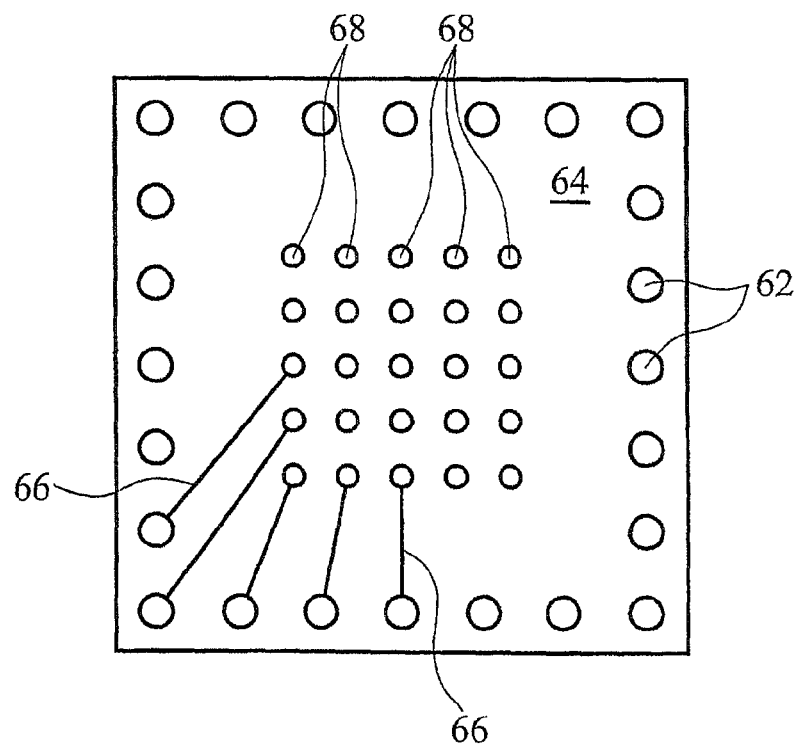

Referring to FIG. 6, a top view of the silicon-based package substrate 64 is illustrated. Through the routing of the metal traces 66, BGA balls 62 connect to the solder bumps 68. A semiconductor chip(s) and a PCB board will be attached to the silicon-based thin substrate 64 from the top side. Similar to the case shown in FIGS. 4B and 4C, a plurality of semiconductor chips can be mounted on the silicon-based thin substrate 64.

Figure 7:
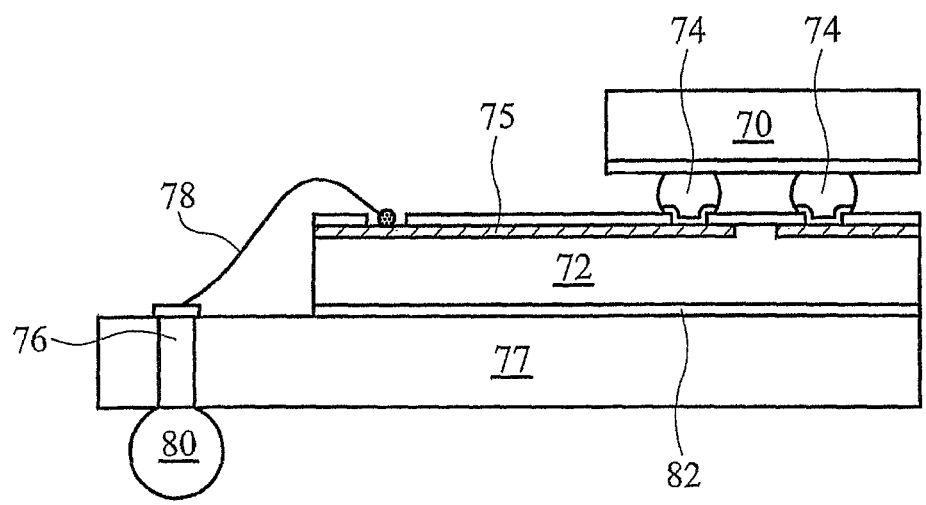
FIG. 7 illustrates a cross-sectional view of a packaging scheme with an additional package substrate, wherein a silicon-based thin substrate is used as a carrier.

FIG. 7 illustrates a further packaging scheme, wherein even lower stress can be achieved. In this embodiment, a silicon-based thin substrate 72 is used as a carrier for attaching a semiconductor chip 70. The connections to the solder bumps 74 are then routed through metal traces 75.

The silicon-based thin substrate 72 is attached to an additional substrate 77. In the preferred embodiment, an organic substrate is used. In other embodiments, other commonly used substrates such as ceramic substrates, flexible substrates, or film substrates can be used as the additional substrate 77. Wire bonds 78 connect through-hole vias 76 to the metal traces 75. BGA balls 80 are attached to the through-hole vias 76 from a different side than that on which the silicon-based thin substrate 72 is attached. With silicon-based thin substrate 72 acting as a buffer, all the BGA balls 80, all the solder bumps 74 and semiconductor chip 70 suffer from smaller stresses. The formation of through-holes and through-hole vias 76 in organic substrates are well known in the art, thus are not repeated herein.

Preferably, silicon-based thin substrate 72 and the additional substrate 77 are attached with an adhesive 82. An advantageous feature of the packaging scheme shown in FIG. 7 is that the silicon-based thin substrate 72 is mounted on a thin and flexible substrate 77, thus the stress of the entire packaging structure can be released by the flexible substrate.

Figure 8:
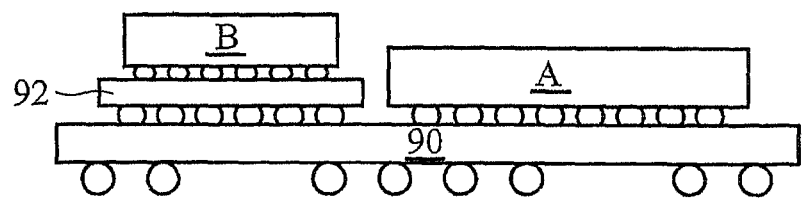
FIG. 8 illustrates a cross-sectional view of a SiP package.

SiP packages are more prone to damages caused by stresses, thus it is advantageous to use silicon-based thin substrates in SiP packages. FIG. 8 illustrates a cross-sectional view of a SiP package, wherein a semiconductor chip A and a semiconductor chip B are mounted on a silicon-based thin substrate 90. In one embodiment, the semiconductor chip B is mounted on the silicon-based thin substrate 90 through an additional substrate 92, which may be an organic substrate. Conductive plugs (not shown) are preferably formed in the through-holes (not shown) in the substrate 92, connecting integrated circuits in semiconductor chip B to silicon-based substrate 90. In other embodiments, the additional substrate 92 is also a silicon-based thin substrate. In yet other embodiments, semiconductor chip B is directly attached to the silicon-based thin substrate 90 without going through a package substrate.

Besides the above-discussed packaging schemes, silicon-based thin substrates may be integrated using various packaging techniques, such as flip-chip packaging, surface mount technology, chip-scale packaging, direct chip attachment, wire bonding with molding compound, 3D packaging, and combinations thereof. These packaging techniques can be combined on a same silicon-based thin substrate in the form of SiP technology.

An advantageous feature related to the present invention is that lower stress is applied on the semiconductor chip, thus the low-k dielectric layers are less likely to delaminate or crack. This not only makes the packages containing extreme low-k dielectric materials more reliable, but also increases the feasibility of integrating more semiconductor chips in SiP technology.

Another advantageous feature of the present invention is that due to reduced stress, lead-free solder bumps, low-lead solder bumps (containing substantially less than about 5% lead) or high-lead solder bumps (containing over 95% lead) can be used. Lead-free, low-lead and high-lead bumps are preferred for either the toxic-free nature or better electromigration performance. However, lead-free bumps are brittle and prone to cracking under stress. With the low stress applied by the preferred embodiments, lead-free bumps can be used.

Besides the benefits associated with reduced stresses, a further advantageous feature of the present invention is that interconnect lines formed on the silicon-based substrate can be very thin. For example, in multi-layer interconnect structures formed on silicon substrates, line width in the first metallization can be 0.6 μm or less. In a commonly accepted design rule, to reduce cross-talk between interconnection lines, line spacing needs to be three times the line width or greater. Therefore, in the preferred embodiment, line spacing can be 1.8 μm or less. As a comparison, interconnect lines formed on organic substrates typically have line widths of about 15 μm to about 18 μm. With such a great line width, line spacing is typically designed close to the line width, otherwise too much space is occupied. This, however, means that cross-talk becomes an issue.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor package assembly comprising:
  a semiconductor chip comprising at least one low-k dielectric layer having a k value of less than about 3.0;
  a silicon-based package substrate having a thickness of less than about 200 μm;
  a package substrate having a first surface and a second surface, the first surface of the package substrate being attached directly to a first surface of the silicon-based package substrate, the semiconductor chip being disposed over a second surface of the silicon-based package substrate;
  a plurality of solder bumps interposed between the semiconductor chip and the second surface of the silicon-based package substrate;
  a plurality of under bump metallizations formed on the second surface of the silicon-based package substrate disposed to receive the plurality of solder bumps;
  a plurality of wire bond lands overlying the second surface of the silicon-based package substrate;
  a plurality of conductive traces disposed on the silicon-based package substrate each having a horizontal portion and each coupling at least one of the under bump metallizations to at least one of the wire bond lands; and
  at least one bond wire connection electrically coupling one of the wire bond lands to a conductive land on the first surface of the package substrate.

2. The semiconductor package assembly of claim 1, wherein the package substrate is an organic substrate.

3. The semiconductor package assembly of claim 1, wherein the package substrate has a plurality of BGA solder balls disposed on the second surface.

4. The semiconductor package assembly of claim 3, wherein at least one of the BGA solder balls is electrically coupled to one of the conductive lands by a through-via in the package substrate.

5. The semiconductor package assembly of claim 1, wherein the thickness of the silicon-based package substrate is less than about 50 μm.

6. The semiconductor package assembly of claim 1, wherein the silicon-based package substrate comprises more than about 40 percent silicon.

7. The semiconductor package assembly of claim 1, wherein the silicon-based substrate comprises more than about 60 percent silicon.

8. The semiconductor package assembly of claim 1, wherein the conductive traces each comprise at least two conductive layers formed on the silicon-based package substrate.

9. The semiconductor package assembly of claim 8, wherein the at least two conductive layers comprise copper.

10. The semiconductor package assembly of claim 1, wherein the conductive traces have damascene structures.

11. The semiconductor package assembly of claim 1, wherein the package substrate comprises one selected from the group consisting essentially of an organic material, a ceramic material, a film material, and a silicon material.

12. The semiconductor package assembly of claim 11 wherein the package substrate is flexible.

13. The semiconductor package assembly of claim 1, wherein the package substrate is attached directly to the silicon-based package substrate using an adhesive.

14. A semiconductor package assembly comprising:
a package substrate;
a silicon-based buffer substrate coupled directly to a first surface of the package substrate;
a semiconductor chip over the silicon-based buffer substrate, wherein the semiconductor chip comprises at least one low-k dielectric layer having a k value of less than about 3.0;
a plurality of solder bumps coupling the semiconductor chip and the silicon-based buffer substrate, wherein the plurality of solder bumps has a lead concentration substantially less than about five percent;
a plurality of under bump metallizations disposed on a first surface of the silicon-based buffer substrate to receive the plurality of solder bumps, the plurality of under bump metallizations forming an outer perimeter, each under bump metallization coupled to a metal trace on the silicon-based buffer substrate having a horizontal portion; and
a plurality of wire bond lands overlying the first surface of the silicon-based buffer substrate; each disposed outside the outer perimeter and coupled by one of the metal traces to at least one of the under bump metallizations.

15. The semiconductor package assembly of claim 14, and further comprising at least one bond wire electrically connecting one of the wire bond lands to a conductor disposed on the first surface of the package substrate.

16. The semiconductor package assembly of claim 14, wherein a thickness of the silicon-based buffer substrate is less than about 50 μm.

17. The semiconductor package assembly of claim 14, wherein the silicon-based buffer substrate comprises more than about 40 percent silicon.

18. The semiconductor package assembly of claim 14, wherein the package substrate is coupled directly to the silicon-based buffer substrate using an adhesive.

19. A silicon-based package assembly comprising:
a plurality of wire bond lands disposed on a first surface of a silicon-based buffer substrate;
a plurality of under bump metallizations formed on the first surface of the silicon-based buffer substrate and forming an outer perimeter inside the plurality of wire bond lands; and
a plurality of metal traces disposed on the silicon-based buffer substrate and having a horizontal portion, connected to the under bump metallizations and the wire bond lands, wherein the silicon-based buffer substrate has a thickness of less than about 200 μm and contains greater than about 40 percent silicon, the silicon-based buffer substrate being free of through vias.

20. The silicon-based package assembly of claim 19, and further comprising a package substrate having conductive lands on a first surface of the package substrate coupled to the wire bond lands on the silicon-based buffer substrate by a plurality of bond wires, and a plurality of BGA balls disposed on a second surface of the package substrate.

21. The silicon-based package assembly of claim 20, wherein the package substrate further comprises a plurality of conductive through-vias in the package substrate coupling a plurality of the BGA balls to a plurality of the conductive lands.

22. The silicon-based package assembly of claim 20, wherein the package substrate further comprises one selected from the group consisting essentially of an organic material, a ceramic material, a film material, and a silicon material.

* * * * *